(12) United States Patent
Duanmu et al.

(10) Patent No.: US 8,821,634 B2
(45) Date of Patent: Sep. 2, 2014

(54) HIGH TEMPERATURE FURNACE INSULATION

(75) Inventors: Ning Duanmu, Nashua, NH (US); Dean C. Skelton, Fitzwilliam, NH (US); Menahem Lowy, Merrimack, NH (US); Dzung Duc Nguyen, Nashua, NH (US)

(73) Assignee: GTAT Corporation, Merrimack, NH (US)

( * ) Notice: Subject to any disclaimer, the term of this patent is extended or adjusted under 35 U.S.C. 154(b) by 26 days.

(21) Appl. No.: 13/069,027

(22) Filed: Mar. 22, 2011

(65) Prior Publication Data

US 2012/0240844 A1    Sep. 27, 2012

(51) Int. Cl.
| | |
|---|---|
| C30B 11/02 | (2006.01) |
| C30B 29/06 | (2006.01) |
| C30B 29/20 | (2006.01) |
| F23M 5/00 | (2006.01) |
| C30B 11/00 | (2006.01) |

(52) U.S. Cl.
CPC .................. *C30B 29/06* (2013.01); *C30B 29/20* (2013.01); *F23M 5/00* (2013.01); *C30B 11/006* (2013.01); *C30B 11/003* (2013.01)
USPC ............... 117/81; 117/201; 117/206; 117/14; 110/317; 110/233; 422/245.1; 422/82.12

(58) Field of Classification Search
CPC .............................. C30B 11/02; C30B 11/002
USPC ........... 117/81, 201; 110/317, 233; 422/245.1
See application file for complete search history.

(56) References Cited

U.S. PATENT DOCUMENTS

| | | | | |
|---|---|---|---|---|
| 3,386,719 | A * | 6/1968 | Martin .......................... | 266/130 |
| 3,985,177 | A * | 10/1976 | Buehler ........................ | 164/462 |
| 4,890,601 | A * | 1/1990 | Potter ........................... | 126/512 |
| 2003/0180579 | A1* | 9/2003 | Waggoner et al. ............ | 428/698 |
| 2009/0309277 | A1* | 12/2009 | Jones ............................ | 266/252 |

FOREIGN PATENT DOCUMENTS

JP        2000290096 A  * 10/2000  .............. C30B 29/06

\* cited by examiner

*Primary Examiner* — Michael Kornakov
*Assistant Examiner* — Hua Qi
(74) *Attorney, Agent, or Firm* — Edwards Wildman Palmer LLP; Steven M. Jensen; Stephen D. LeBarron

(57) ABSTRACT

A high temperature furnace comprising hot zone insulation having at least one shaped thermocouple assembly port to reduce temperature measurement variability is disclosed. The shaped thermocouple assembly port has an opening in the insulation facing the hot zone that is larger than the opening on the furnace shell side of the insulation. A method for producing a crystalline ingot in a high temperature furnace utilizing insulation having a shaped thermocouple assembly port is also disclosed.

2 Claims, 8 Drawing Sheets

HIGH TEMPERATURE FURNACE INSULATION

BACKGROUND OF THE INVENTION

1. Field of Invention

The present invention relates to a high temperature furnace comprising insulation having a shaped thermocouple assembly port.

2. Description of the Related Art

Crystallization furnaces, such as directional solidification systems (DSS) and heat exchanger method (HEM) furnaces, involve the melting and controlled resolidification of a feedstock material in a crucible to produce an ingot. Production of an ingot from molten feedstock occurs in several specific temperature steps and temperature rates over many hours. For example, to produce a silicon ingot by the DSS method, silicon feedstock is added to a crucible, often contained in a graphite crucible box, placed into a DSS furnace and then heated to fully melt the feedstock. Typically, heating from room temperature to 1200° C. occurs over several hours at specified temperature rates before further heating for several hours up to 1550° C. The temperature, well above the silicon melting temperature of 1412° C., is maintained for several hours at this temperature to completely melt the silicon feedstock before applying a temperature gradient over 18 hours to directionally solidify the melt. The temperature is then reduced below the melting point of silicon to anneal the ingot over several hours, and, thereafter, the furnace is cooled down for several more hours before removing the formed ingot.

The challenge in consistently producing high quality ingots in a production scale furnace is to ensure that the melting, solidification, and annealing temperatures, temperature rates, and times can be accurately and consistently measured in the furnace hot zone where ingot formation occurs. For example, the hot zone of a furnace generally comprises a crucible containing feedstock and at least one heating element above or beside the crucible to melt the feedstock. Insulation typically surrounds at least the top and sides of the crucible and heating element(s) to contain the heat and define the hot zone, with one side of the insulation facing the furnace shell wall and the other side facing the heating element(s) within the hot zone. At least one thermocouple assembly, positioned through a thermocouple assembly port in the insulation and into the hot zone, is typically used in conjunction with a computer feedback mechanism to the heater power source to measure, control and maintain the correct temperature during various phases of ingot growth. Conventionally, the size or diameter of the port opening on the side of the insulation that faces the furnace shell is generally substantially equal to the size of the port opening on the side of the insulation that faces the heating element, creating a generally cylindrical port. The thermocouple assembly, typically comprising a thermocouple sensor encased in heat-protecting tubes housed in a protective sheath, for example, graphite, fits into and through this cylindrical port.

In an effort to grow ever larger ingots with existing production equipment, space within the hot zone must be maximized, often requiring that the heating elements reside in close proximity to the hot zone insulation. As such, thermocouple assembly(s) placed through conventional ports in the insulation to monitor process temperatures in the hot zone are typically positioned close to the heating element, for example, less than an inch. This close proximity places the thermocouple assembly in a large temperature gradient zone ranging from approximately 1500° C. at the heating element side of the insulation to approximately 1600-1700° C. at the heating element surface. This temperature gradient, typically spanning less than two inches from the insulation to the heating element surface, makes the placement of the thermocouple assembly highly susceptible to positional temperature measurement variability.

Difficulties in ensuring consistently repeatable heater control temperature measurements arise when a thermocouple assembly must be placed in a furnace at a specific distance relative to the heating element because the measured temperature is highly dependent on that distance. Therefore, the high positional sensitivity of the thermocouple assembly placed in a large temperature gradient zone can result in significant differences in the measured temperatures if not accurately placed in the designated position, requiring expensive and time consuming effort to measure and compensate for the observed differences.

As such, there is an increasing need in the industry for a simpler, more reliable, and cost effective means to position a thermocouple assembly in a high temperature furnace so that the resulting measured heater control temperature is substantially insensitive to thermocouple assembly position. The present invention reduces this high positional sensitivity and results in more consistent and repeatable heater control temperature measurements required for high quality ingot growth.

SUMMARY OF THE INVENTION

The present invention relates to a furnace comprising a furnace shell, a hot zone within the furnace shell comprising at least one heating element in the hot zone, insulation surrounding the hot zone having a furnace shell side facing the furnace shell and a heating element side facing the heating element, and at least one thermocouple assembly inserted through at least one thermocouple assembly port in the insulation. The thermocouple assembly port increases in size from the furnace shell side of the insulation to the heating element side of the insulation. Preferably, the thermocouple assembly port is either countersunk or counterbored.

The present invention further relates to insulation surrounding a hot zone of a furnace, wherein the insulation has a furnace shell side and a heating element side and comprises at least one thermocouple assembly port through the insulation to insert a thermocouple assembly. The thermocouple assembly port is either countersunk or counterbored on the heating element side of the insulation. The insulation can be configured to be arranged between a furnace shell of a furnace and a heating element in a hot zone of the furnace, with the furnace shell side facing the furnace shell and the heating element side facing the heating element.

The present invention also relates to a method for producing a crystalline ingot in a furnace comprising a furnace shell and a hot zone, wherein the insulation surrounding the hot zone comprises a shaped thermocouple assembly port. The method comprises the steps of heating a crucible containing at least feedstock material in the hot zone of the furnace to a temperature greater than or equal to 1000° C., wherein the hot zone comprises at least one heating element, and insulation surrounds the hot zone, the insulation being between the heating element and the furnace shell of the furnace and having a heating element side facing the heating element and a furnace shell side facing the furnace shell, and measuring the temperature in the hot zone with at least one thermocouple assembly inserted through a thermocouple assembly port in the insulation to a position between the heating element and the heating element side of the insulation. The thermocouple assembly port increases in size from the furnace shell side of the insulation to the heating element side of the insulation, and the measured temperature is substantially insensitive to the position of the thermocouple assembly.

The present invention further relates to a method for reducing the positional temperature sensitivity of a thermocouple assembly inserted in a thermocouple assembly port and placed into a furnace hot zone. The method comprises the steps of providing a furnace comprising a furnace shell, a hot zone within the furnace shell wherein the hot zone comprises at least one heating element in the hot zone, insulation surrounding the hot zone having a furnace shell side facing the furnace shell and a heating element side facing the heating element, at least one thermocouple assembly, and at least one thermocouple assembly port in the insulation wherein the thermocouple assembly port comprises an opening on the heating element side of the insulation and an opening on the furnace shell side of the insulation, and the opening on the heating element side of the insulation is larger than the opening on the furnace shell side of the insulation. The thermocouple assembly is inserted through a thermocouple assembly port from the furnace shell side of the insulation to a position between the heating element and the heating element side of the insulation to measure temperature in the hot zone.

It is to be understood that both the foregoing general description and the following detailed description are exemplary and explanatory only and are intended to provide further explanation of the present invention, as claimed.

DETAILED DESCRIPTION OF THE INVENTION

Figure 1:
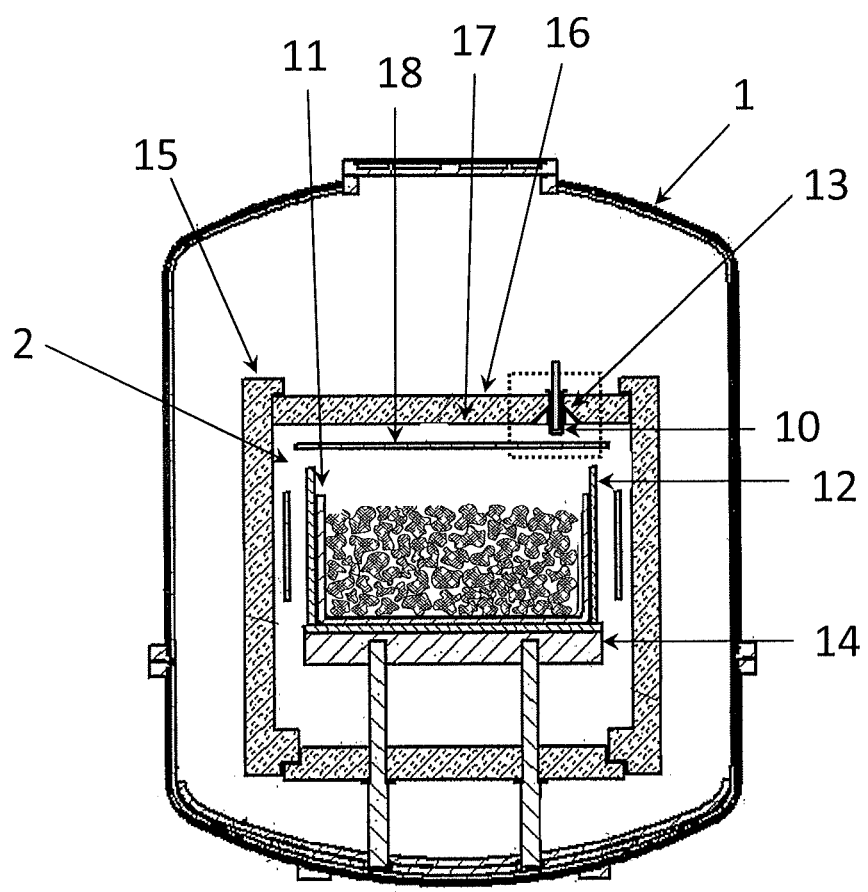
FIG. 1 is a cross-sectional schematic view of a high temperature furnace of the present invention comprising a hot zone surrounded by insulation having a shaped thermocouple assembly port.

The present invention relates to a furnace, a hot zone within the furnace comprising a heating element, insulation surrounding and defining the hot zone having a shaped thermocouple assembly port, and to a method of producing a crystalline ingot using this furnace and insulation.

The furnace of the present invention comprises a furnace shell and a hot zone within the furnace shell. The furnace shell can be any known in the art used for high temperature crystallization furnaces, including a stainless steel shell comprising an outer wall and an inner wall defining a cooling channel for circulation of a cooling fluid, such as water. The hot zone of the furnace, comprising at least one heating element within the hot zone, is surrounded by and defined by, insulation. The insulation will be described in more detail below. In addition, the hot zone of the furnace may further comprise a crucible in a crucible support box atop a crucible support block. In one embodiment, the hot zone comprises a top heating element, positioned in the upper region of the hot zone above the crucible, and at least one side heating element positioned below the top heating element and along the sides of the hot zone and the crucible. Any crucible known in the art may be used. The crucible may be made of various heat resistant materials, for example, quartz, silica, graphite or molybdenum, can be cylindrical or square in dimension or tapered, and optionally, may be coated to prevent cracking of the ingot after solidification. The crucible support box and crucible support block are typically made of graphite.

The crucible containing feedstock is heated by at least one heating element in the hot zone. Melting of the feedstock preferably is controlled by regulating the power to the at least one heating element. Directional solidification of the melt is achieved through controlled heat extraction from the crucible by increasing radiant heat losses to the water-cooled chamber, such as through the bottom of the hot zone. This can be achieved, for example, by moving the insulation relative to the crucible so as not to disturb the solid-to-liquid interface of the growing ingot.

The insulation that surrounds and defines the hot zone of the furnace of the present invention can be made of any material known in the art that possesses low thermal conductivity and is capable of withstanding the temperatures and conditions in the furnace, including, for example, graphite. The insulation may comprise flat panels, for example, when a square crucible is used, though other insulation dimensions may be used commensurate with other furnace hot zone shapes, for example, a cylindrical hot zone. The insulation typically surrounds the feedstock-charged crucible and at least one heating element, above and on all four sides of the crucible. Insulation may also be employed below the crucible, for example, below the crucible support block. The insulation has a furnace shell side facing the shell of the furnace and a hot zone side facing the hot zone. Preferably, the shape and dimension of the insulation panels conform to the shape and size of the crucible used. For example, where a square crucible of a given dimension is used to melt feedstock, then square insulation panels at least as large as the crucible top and sides are used. In one embodiment, the insulation comprises top and side insulation panels, and preferably the side insulation is configured to move vertically relative to a crucible within the hot zone.

In another embodiment of the present invention, a heat exchanger may be employed in the furnace, either alone or in conjunction with insulation configured to be moved relative to a crucible, to control heat extraction. A gas-cooled heat exchanger, for example, a helium-cooled heat exchanger, can be arranged beneath the crucible, to promote solidification of the melted feedstock.

The furnace of the present invention further comprises at least one thermocouple assembly inserted through at least one thermocouple assembly port in the insulation, which will be described in more detail below. The thermocouple assembly can comprise a thermocouple assembly sensor encased in heat-protecting tubes housed in a protective sheath, for example, made of graphite. The thermocouple assembly is used to measure the temperature in the hot zone surrounded and defined by insulation in the furnace and can be any thermocouple assembly known in the art used to measure high temperatures typically associated with heating, melting and resolidifying of feedstock material. At least one thermocouple assembly is used in one embodiment of the present invention to measure temperature in the hot zone near the heating element above the crucible, where feedstock is melted and resolidified to form an ingot.

The thermocouple assembly port in the insulation of the present invention through which the thermocouple assembly is inserted to measure the temperature in the hot zone increases in size from the furnace shell side of the insulation to the heating element side of the insulation. The port opening on the furnace shell side is shaped and sized to accommodate the thermocouple assembly. Thermocouple assembly ports can be configured in insulation at least above and at the sides of the crucible. At least one port is configured in the top insulation of the furnace of the present invention to measure temperature near the top heating element used to melt feedstock in the crucible. The thermocouple assembly port opening on the heating element side of the insulation is enlarged in the present invention to expose more of the surface area of the thermocouple assembly to heat. Specific embodiments of the shaped thermocouple assembly port are shown in FIG. 1 and FIG. 3A-FIG. 6 and discussed below.

FIG. 1 shows a cross-sectional view of a furnace of the present invention comprising a furnace shell 1 and hot zone 2 surrounded and defined by insulation 15 having a shaped thermocouple assembly port 13 wherein the size of the port opening on the heating element side 17 of the insulation is larger than the size of the port opening on the furnace shell side 16 of the insulation. Thermocouple assembly 10 is inserted into thermocouple assembly port 13 through the furnace shell side 16 of insulation 15 and beyond the heating element side 17 of insulation 15 to near heating element 18 to measure the temperature in the hot zone during the melting and resolidification of feedstock, for example, silicon or alumina oxide-based feedstock, to produce crystalline silicon or sapphire ingots, respectively. As shown for this embodiment of the furnace of the present invention, at least one heating element is positioned above and along side of crucible 11 in crucible box 12 atop crucible support block 14, to melt feedstock in the crucible.

Figure 2:
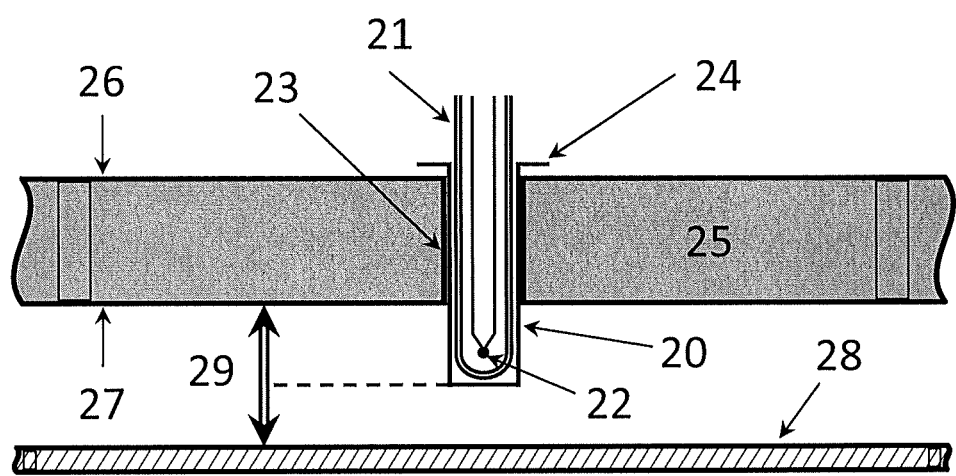
FIG. 2 shows a cross-sectional schematic view of insulation comprising a thermocouple assembly positioned in a conventional thermocouple assembly port known in the art.

FIG. 2 shows a conventional thermocouple assembly and thermocouple assembly port shape known in the art. Structurally, thermocouple assembly 20 generally comprises an outer heat-protecting sheath 24, typically made of graphite, covering heat-protecting tubes 21 that further enclose and isolate thermocouple sensor 22. Thermocouple assembly 20 is typically inserted through a thermocouple assembly port 23 appropriately configured to the size of the thermocouple assembly and positioned in close proximity to heating element 28. In general, the size or diameter of the port opening at the furnace shell side 26 of insulation 25 generally equals the size of the opening on the heating element side 27 of the port. Because insulation 25 comprises low thermal conductivity material, for example, graphite, a large thermal gradient exists across thermal gradient zone 29 from the heating element side 27 of insulation 25 (approximately 1500° C.) to the surface of heating element 28 (approximately 1600-1700° C.). This large thermal gradient across a short distance makes thermocouple assembly 20 highly sensitive to positioning in thermocouple assembly port 23 which can lead to large variations and decreased repeatability in the temperatures measured.

Figure 3A:
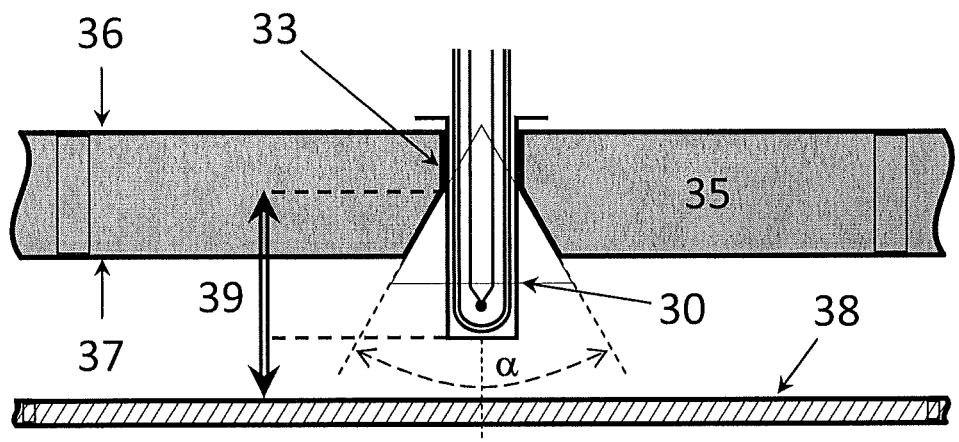
FIGS. 3A, 3B, 3C and 3D are cross-sectional schematic views of embodiments of insulation of the present invention having a conical shaped thermocouple assembly port wherein the port is countersunk at the heating element side of the insulation at symmetrical and asymmetrical angles.

The large variations attributable to inconsistent thermocouple assembly placement in a large temperature gradient can surprisingly be minimized using insulation of the present invention having a shaped thermocouple assembly port. FIG. 3A, FIG. 3B, FIG. 3C and FIG. 3D show embodiments of the present invention in which the thermocouple assembly port 33 is conically-shaped, exposing more surface area of thermocouple assembly 30 to the high temperatures of the hot zone and reducing its sensitivity to positional changes in thermocouple assembly port 33 by expanding the temperature gradient zone 39. Referring to FIG. 3A, the opening of the thermocouple assembly port on the furnace shell side 36 of insulation 35 is configured to receive a standard size thermocouple assembly 30, typically approximately one inch in diameter although any diameter can be used. The thermocouple assembly port 33 has an opening on the heating element side 37 of insulation 35 that is larger than the opening on the furnace shell side 36 of insulation 35. The thermocouple assembly port can be enlarged by countersinking the opening, forming a conical shape that exposes more of the thermocouple assembly 30 to heat generated by heating element 38 without significant loss of insulation or insulating capability. Thus, as shown in FIG. 3A, the enlarged, conical opening in thermocouple assembly port 33 at the heating element side 37 of insulation 35 results in more of the surface area of thermocouple assembly 30 being exposed to high temperatures, thus expanding temperature gradient zone 39 along its length, from the tip of thermocouple assembly 30 to the point where insulation 35 meets thermocouple assembly 30.

Figure 3B:
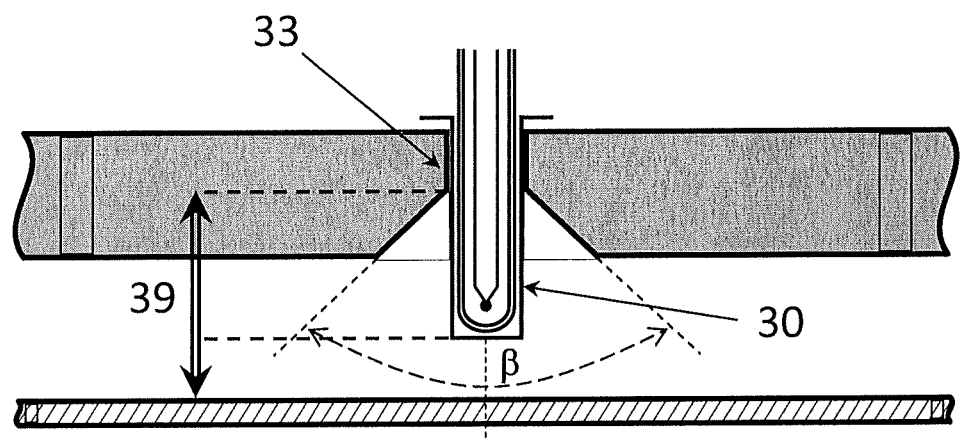
Figure 3C:
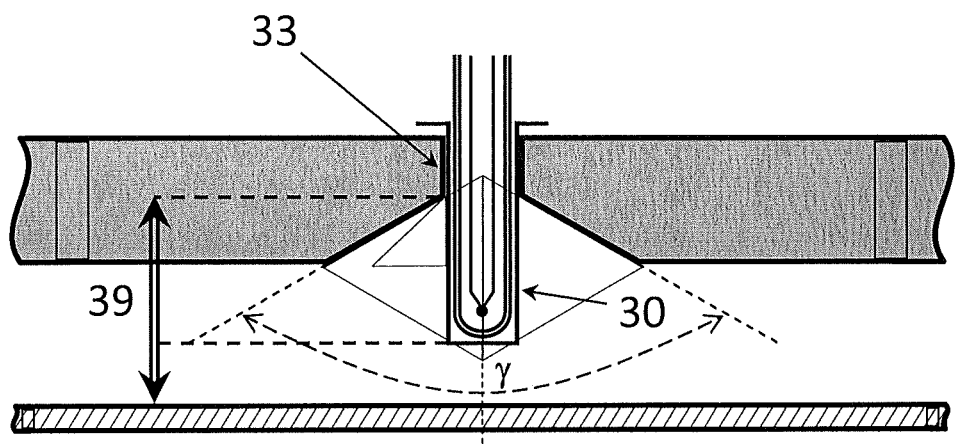
Figure 3D:
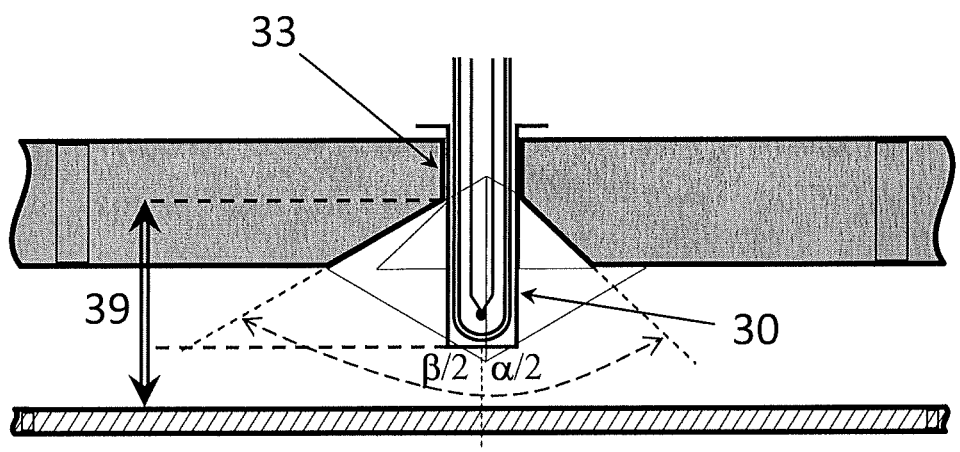

Conical shapes may be created in insulation 35 by various means known in the art, including, for example, by countersinking with a countersink tool. The cross-sectional area of the conical opening of thermocouple assembly port 33 on the heating element side 37 of insulation 35 may vary depending on the desired angle and the depth of the countersunk port. For example, the port can be countersunk through at least approximately one-half of the thickness of the insulation, though other depths are contemplated. Furthermore, various countersink angles may be used. For example, the port can be countersunk at an angle of at least about 60°, at least about 90°, or at least about 120°, such as from about 60° to about 120°. Examples of specific countersink angles are shown in FIG. 3A ($\alpha$=60°), FIG. 3B ($\beta$=90°) and FIG. 3C ($\gamma$=120°). Other angles may also be contemplated so long as they expose more of the surface area of thermocouple assembly 30 to the heating environment to form an expanded temperature gradient zone 39 along the length of thermocouple assembly 30. Furthermore, while the thermocouple assembly port openings as shown in FIG. 3A, FIG. 3B and FIG. 3C are symmetrical on each side of the center thermocouple assembly axis, in an alternative embodiment, the conical shape may also be angularly asymmetrical in relation to the center axis of the thermocouple assembly. For example, as shown in FIG. 3D, the thermocouple assembly port can have an opening having two different countersink angles, such as $\alpha$60° and $\beta$=90° (half of these angles are shown).

Figure 4A:
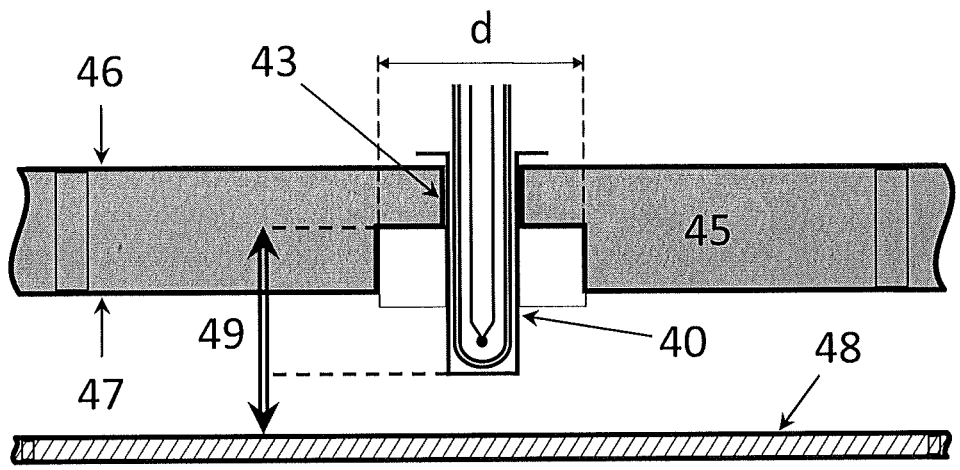
FIGS. 4A and 4B are cross-sectional schematic views of embodiments of insulation of the present invention having a shaped thermocouple assembly port wherein the port is counterbored.
Figure 4B:
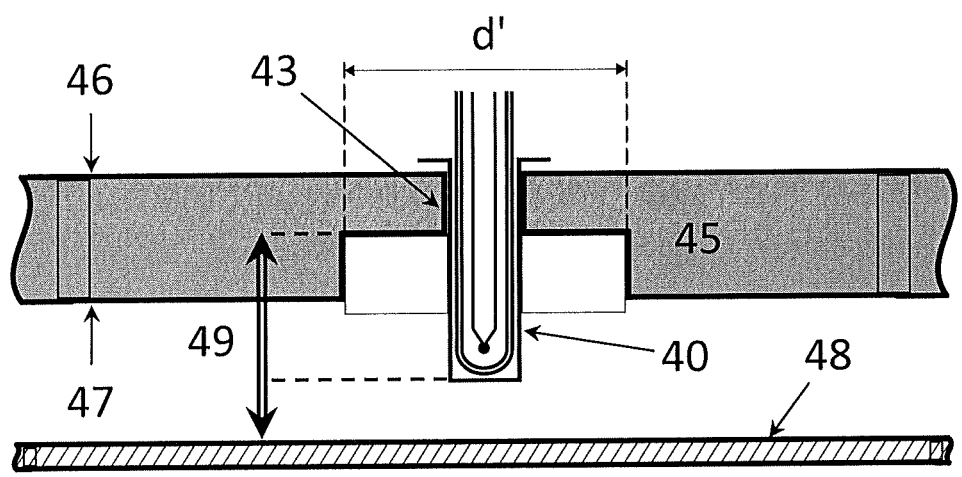

FIG. 4A and FIG. 4B show additional embodiments of the present invention in which thermocouple assembly port 43 is counterbored on the heating element side 47 of insulation 45 to expose more of the surface area of thermocouple assembly 40 to heat generated by heating element 48 and to expand the size of temperature gradient zone 49 in which thermocouple assembly 40 resides. Counterbored shapes may be created by various means known in the art, including, for example, by counterboring thermocouple assembly port 43 on the heating element side 47 of insulation 45 with a circular counterbore tool, thereby forming a cylindrical port opening without significant loss of insulating capability. The width of the counterbore can vary, as shown by d and d' in FIG. 4A and FIG. 4B respectively. The port can also be counterbored to various depths, such as through at least approximately one-half of the thickness of the insulation, though other depths are contemplated by the present invention. Other counterbore shapes are also contemplated by the present invention, including, but not limited to, square and other polygonal shapes that can be cut into the heating element side 47 of insulation 45 or produced using multiple layers of insulation. The alternative shapes can be created using various cutting means known in the art. In an alternative embodiment shown in FIG. 6, a hybrid thermocouple assembly port can be formed wherein the thermocouple assembly port is first counterbored, such as with a width d, on the heating element side of the insulation and then countersunk at the various angles contemplate herein. Thus, various counterbored shapes, widths and depths are contemplated in the present invention so long as they result in more thermocouple assembly 40 surface area exposure to high temperatures and expand temperature gradient zone 49 along its length, from the tip of thermocouple assembly 40 to the point where insulation 45 meets thermocouple assembly 40.

Figure 5A:
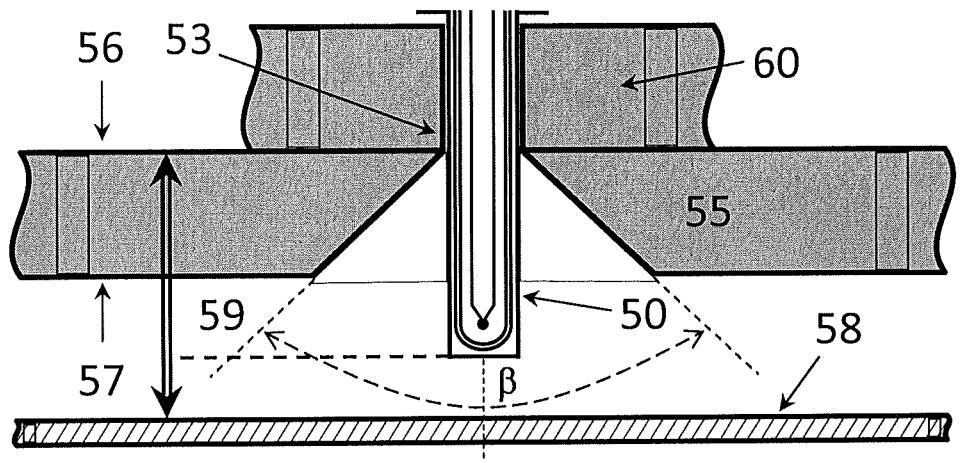
FIGS. 5A 5B, and 5C are cross-sectional schematic views of embodiments of insulation of the present invention having a shaped thermocouple assembly port and an insulation flange at the furnace shell side of the insulation.
Figure 5B:
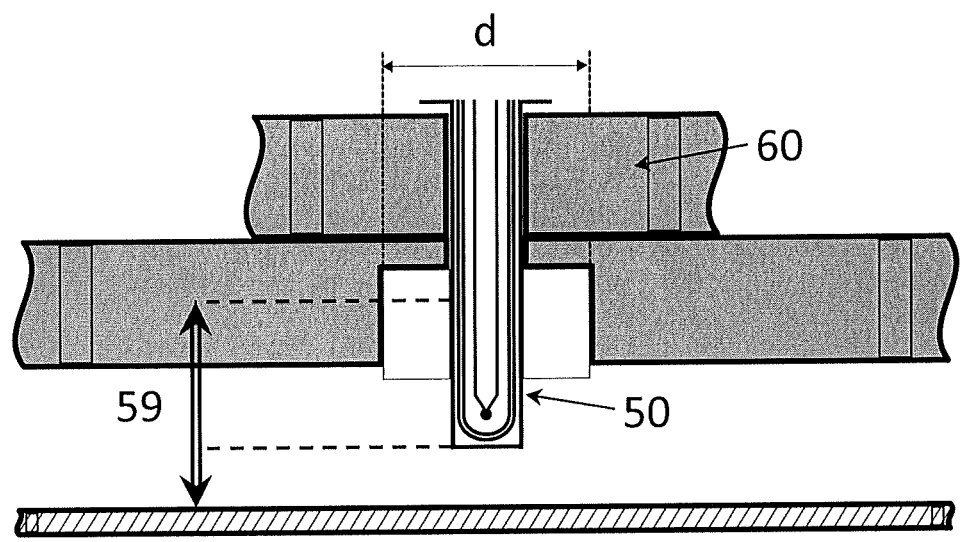
Figure 5C:
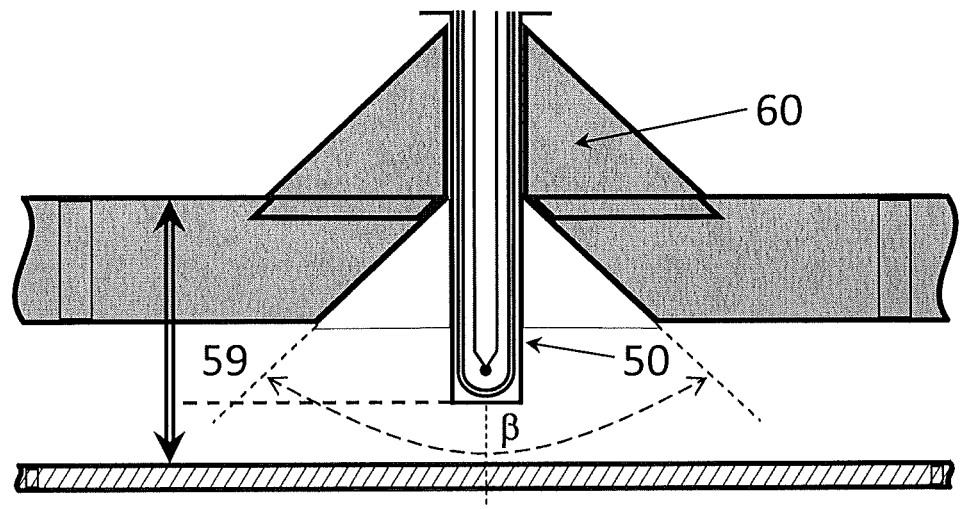
Figure 6:
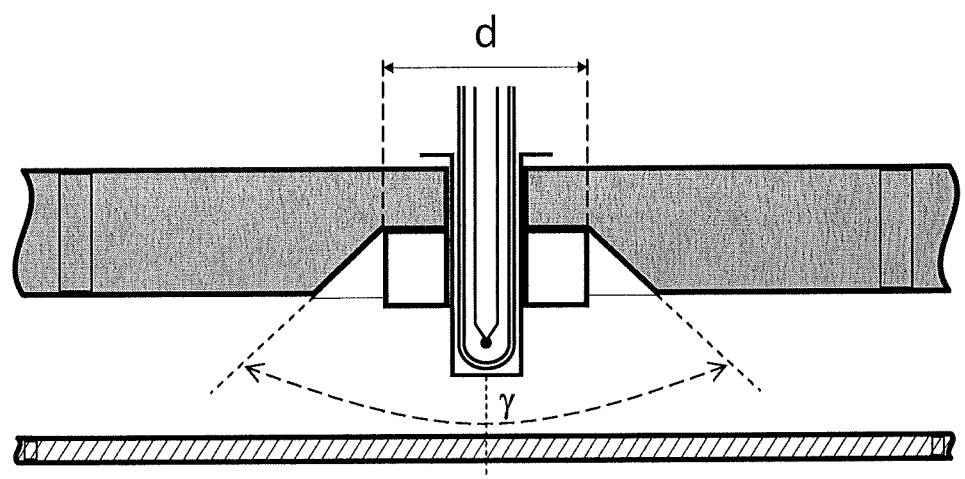
FIG. 6 is a cross-sectional schematic view of an embodiment of a hybrid shaped thermocouple assembly port produced by counterboring and countersinking.

FIG. 5A, FIG. 5B and FIG. 5C show alternative embodiments of the present invention wherein the heating element side 57 of insulation 55 is countersunk (FIG. 5A and FIG. 5C) or counterbored (FIG. 5B) to a depth substantially greater than one-half of the thickness of insulation 55 to expose more of its overall surface area to heat generated by heating element 58. In particular, FIG. 5A shows a conical-shaped thermocouple assembly port 53 that is countersunk at a 90° angle (β=90) from the heating element side 57 of insulation 55 and extending through to the furnace shell side 56 of the insulation, with the port opening on the furnace shell side 56 coinciding with the diameter of thermocouple assembly 50. The conical shape may be created by various means known in the art, including, for example, with a countersink tool. Other angles are also contemplated in the present invention so long as they expose more of the surface area of thermocouple assembly 50 to heat generated by heating element 58, thus expanding the size of temperature gradient zone 59 along its length, from the tip of thermocouple assembly 50 to the point where insulation 55 meets thermocouple assembly 50.

Because the countersunk port of FIG. 5A extends completely through insulation 55, the present invention also contemplates using an insulation flange 60 to provide additional structural support to thermocouple assembly 50 at the furnace shell side 56 of the insulation and to minimize heat leakage from the hot zone into the furnace chamber, thereby maintaining insulating capability. Insulation flange 60 typically comprises the same material used for furnace insulation, including, for instance, graphite, but may be made of any material known in the art that possesses low thermal conductivity and is capable of withstanding the temperatures and conditions within the furnace. The flange may have various shapes, dimensions and thicknesses so long as it adequately supports the thermocouple assembly and minimizes heat leakage from the hot zone. For example, the insulation flange can be flat and at least about one-half the thickness of the insulation. The flange may be affixed to the furnace shell side 56 of the insulation 55 by various means known in the art or, where the thermocouple assembly 50 is placed in insulation directly above the crucible, the flange may rest on the surface of the furnace shell side 56 of the insulation. FIG. 5B of the present invention also contemplates using a flat insulation flange 60 to structurally support the thermocouple assembly and minimize heat leakage from the hot zone where a thermocouple assembly port is counterbored with a width d and to a depth that is greater than one-half of the thickness of the insulation. In another embodiment of the present invention, FIG. 5C shows that a solid, conical shaped insulation flange 60 can be used in conjunction with a countersunk thermocouple assembly port to provide structural support to thermocouple assembly 50 and minimize heat leakage from the hot zone, though its use with counterbored or other shaped thermocouple assembly port shapes is also contemplated.

Figure 7:
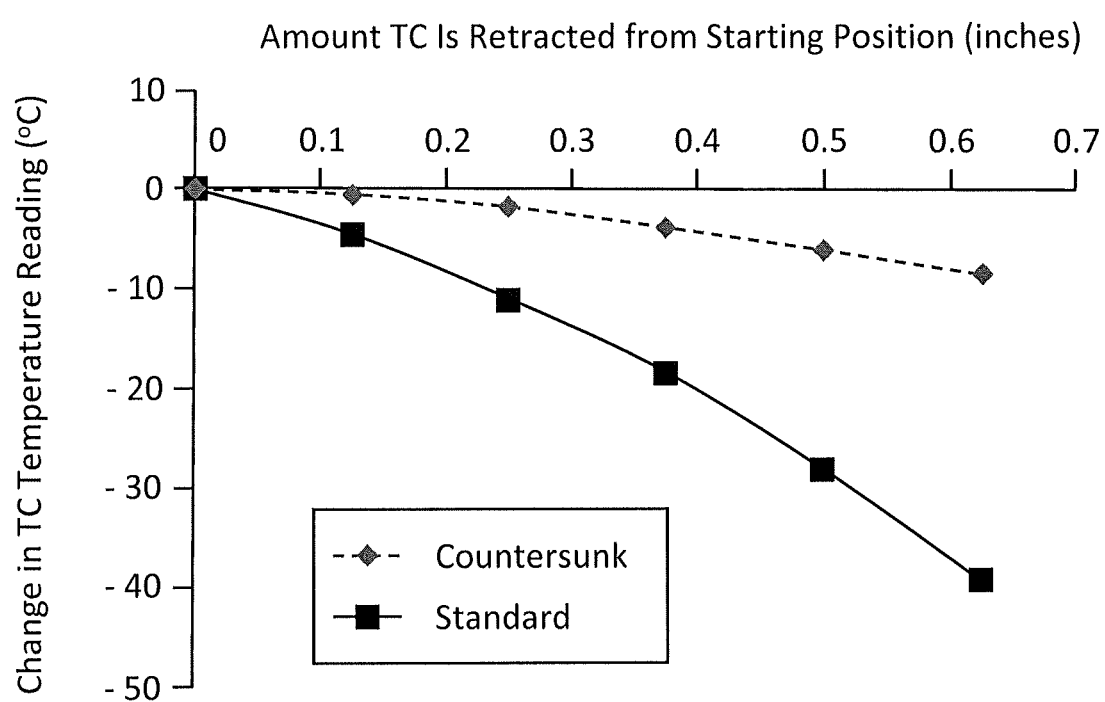
FIG. 7 graphically compares temperature changes associated with retraction of a thermocouple assembly in a conventional thermocouple assembly port through conventional insulation and a conical shaped thermocouple assembly port through insulation of the present invention.

The furnace of the present invention, comprising a shaped thermocouple assembly port in the insulation that increases in size from the furnace shell side of the insulation to the heating element side of the insulation, surprisingly reduces the high positional temperature measurement sensitivity typically observed from a thermocouple assembly inserted through the insulation in conventional furnaces having conventional thermocouple assembly ports. As a result, small positional movements of the thermocouple assembly from a starting position result in minimal variation in measured temperature. FIG. 7 graphically compares the effect of changes in the vertical position of a top insulation-mounted thermocouple assembly (TC) on the recorded temperature measurements for a conventional insulation with a standard thermocouple assembly port and insulation of the present invention having a shaped countersunk port (90° angle). In each port, the tip of the thermocouple assembly was placed at a starting position approximately 0.5 inches from the top heating element and the heating element was powered on until a temperature of approximately 1560° C. was reached and maintained. Thereafter, the TC was retracted in 0.125 inch increments and the temperature measured at each position. FIG. 7 shows that, after retracting the tip of TC approximately 0.625 inches in incremental steps from its starting position, the temperature observed for insulation having the standard thermocouple assembly port dropped continuously to nearly 40° C. in contrast to a less than 10° C. drop in the observed temperature when the tip of TC was retracted the same distance through the shaped thermocouple assembly port in insulation of the present invention. The results surprisingly show that the shaped thermocouple assembly port minimizes the variation in measured temperature associated with the high positional sensitivity of a thermocouple assembly, compared to conventional insulation having thermocouple assembly ports typically used in the art.

The present invention further relates to insulation surrounding a furnace hot zone. The insulation is configured to be arranged between the furnace shell wall and at least one heating element in the furnace hot zone, and comprises a furnace shell side and a heating element side and at least one thermocouple assembly port to accommodate a thermocouple assembly. The cross-sectional area of the opening of thermocouple assembly port is greater on the heating element side of the insulation than the furnace shell side and can be any of those described in more detail above. For example, the opening can be circular, square or polygonal in shape on the surface of heating element side and countersunk or counterbored to form a conical or cylindrical shape cross-sectionally to at least half the thickness of the insulation.

The present invention also relates to a method of producing a crystalline ingot in a furnace comprising a furnace shell, a hot zone and insulation surrounding and defining the hot zone wherein the insulation has at least one shaped thermocouple assembly port. The method comprises the steps of heating a crucible containing at least feedstock material in the hot zone of the furnace to a temperature greater than or equal to 1000°

C. The hot zone, comprising at least one heating element, is surrounded by and defined by, insulation between the at least one heating element and the furnace shell of the furnace, and the insulation has a heating element side facing the heating element and a furnace shell side facing the furnace shell. The method further comprises the step of measuring the temperature in the hot zone with at least one thermocouple assembly inserted through a thermocouple assembly port in the insulation that is larger in cross-sectional area on the heating element side of the insulation than on the furnace shell side of the insulation. The measured temperature is substantially insensitive to the position of the thermocouple assembly.

The present invention further relates to a method for reducing the sensitivity of a thermocouple assembly to temperature measurement variability associated with its position in the thermocouple assembly port in the insulation of a furnace. The method comprises the steps of providing a furnace, furnace shell, a hot zone within the furnace shell wherein the hot zone comprises at least one heating element in the hot zone, insulation surrounding the hot zone having a furnace shell side facing the furnace shell and a heating element side facing the heating element, at least one thermocouple assembly, and at least one thermocouple assembly port in the insulation wherein the thermocouple assembly port comprises an opening on the heating element side of the insulation and an opening on the furnace shell side of the insulation, and the opening on the heating element side of the insulation is larger than the opening on the furnace shell side of the insulation. The method further comprises the step of inserting a thermocouple assembly through a thermocouple assembly port from the furnace shell side of the insulation to a position between the heating element and the heating element side of the insulation to measure temperature in the hot zone.

The foregoing description of preferred embodiments of the present invention has been presented for the purposes of illustration and description. It is not intended to be exhaustive or to limit the invention to the precise form disclosed. Modifications and variations are possible in light of the above teachings, or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A method for producing a crystalline ingot in a furnace comprising a furnace shell and a hot zone, the method comprising the steps of:

heating a crucible containing at least feedstock material in the hot zone of the furnace to a temperature greater than or equal to 1000° C., wherein the hot zone comprises at least one heating element disposed above the crucible, and insulation surrounds the hot zone, the insulation being between the heating element and the furnace shell of the furnace, and the insulation having a heating element side facing the heating element and a furnace shell side facing the furnace shell; and measuring the temperature within the hot zone between the at least one heating element disposed above the crucible and the heating element side facing the heating element of the insulation with at least one thermocouple assembly inserted through a thermocouple assembly port formed in the insulation above the at least one heating element disposed above the crucible, the at least one thermocouple assembly being disposed in a position between the heating element and the heating element side of the insulation, wherein the thermocouple assembly port above the at least one heating element increases in size within the insulation from the furnace shell side of the insulation to the heating element side of the insulation and wherein the measured temperature is substantially insensitive to the position of the thermocouple assembly.

2. A method of reducing the positional temperature sensitivity of a thermocouple assembly inserted in a thermocouple assembly port, comprising the step of:

assembling a furnace with a furnace shell, a hot zone within the furnace shell wherein the hot zone comprises at least one heating element in the hot zone above a crucible, insulation surrounding the hot zone, and the insulation having a furnace shell side facing the furnace shell and a heating element side facing the heating element, at least one thermocouple assembly positioned within the insulation; and forming at least one thermocouple assembly port in the insulation wherein the thermocouple assembly port comprises an opening on the heating element side of the insulation and an opening on the furnace shell side of the insulation, and the opening on the heating element side of the insulation is larger than the opening on the furnace shell side of the insulation, wherein the thermocouple assembly port increases in size within the insulation from the furnace shell side of the insulation to the heating element side of the insulation and wherein the thermocouple assembly measures the temperature between the heating element above the crucible and the insulation within the hot zone and the measured temperature is substantially insensitive to the position of the thermocouple assembly, wherein the opening on the heating element side of the insulation opens into a space above the at least one heating element which is above the crucible.

* * * * *